United States Patent [19]

Sway-Tin et al.

[11] Patent Number: 5,561,380

[45] Date of Patent: Oct. 1, 1996

[54] FAULT DETECTION SYSTEM FOR ELECTRIC AUTOMOBILE TRACTION SYSTEM HAVING FLOATING GROUND

[75] Inventors: Min Sway-Tin, Troy; Pawel J. Golab, Birmingham; Jan S. Pyko, Bloomfield Township, all of Mich.

[73] Assignee: Chrysler Corporation, Highland Park, Mich.

[21] Appl. No.: 436,560

[22] Filed: May 8, 1995

[51] Int. Cl.$^6$ .................................................. G01R 31/02
[52] U.S. Cl. ........................ 324/509; 324/426; 324/433
[58] Field of Search ........................... 323/283, 266; 364/483; 324/425–437, 500, 458, 457, 503, 509, 510; 320/20, 21, 39, 46, 48; 318/139, 439, 695; 363/132, 137, 27, 124; 191/2, 1 R, 29 R; 388/807

[56] References Cited

U.S. PATENT DOCUMENTS

| | | | |
|---|---|---|---|
| 2,022,758 | 12/1935 | Corderman | 177/311 |
| 3,066,284 | 11/1962 | McKinley et al. | 340/255 |
| 3,489,865 | 1/1970 | Waitz et al. | 179/175.11 |
| 3,668,472 | 6/1972 | Shields et al. | 317/18 R |
| 3,700,966 | 10/1972 | Morrow | 317/18 D |
| 3,754,221 | 8/1973 | Stelter | 340/255 |
| 3,766,435 | 10/1973 | Childers | 317/18 A |
| 3,801,898 | 4/1974 | Young | 324/51 |
| 3,890,556 | 6/1975 | Melling et al. | 320/21 |
| 3,936,718 | 2/1976 | Melling et al. | 320/20 |
| 3,975,663 | 8/1976 | Moorey | 317/18 R |
| 4,002,972 | 1/1977 | Konrad et al. | 324/500 |
| 4,206,502 | 6/1980 | Harries et al. | 363/124 |
| 4,605,827 | 8/1986 | Chattler | 179/175.3 |
| 4,791,517 | 12/1988 | Park | 361/1 |
| 5,142,428 | 8/1992 | Takeda | 361/42 |
| 5,146,397 | 9/1992 | Fruhling | 363/74 |
| 5,382,946 | 1/1995 | Gale | 340/650 |

Primary Examiner—Michael Tokar
Attorney, Agent, or Firm—Margaret A. Dobrowitsky

[57] ABSTRACT

A fault detection system detects the existence of unwanted electrical paths between the high voltage traction system of an electric car and the chassis of the car. The fault detection system includes a positive sampling RC circuit connected to the positive conductor of the traction system and a negative sampling RC circuit connected to the negative conductor of the traction system. Each RC circuit generates a voltage, and the voltages are balanced, i.e., the voltages are equal and opposite, when no leakage path exists. In contrast, when a leakage path to chassis exists, the voltages are not balanced. A comparator compares the sum of the voltages to a setpoint which varies proportionately to the varying voltage of the battery of the traction system, and a fault condition is indicated when the sum of the voltages exceeds the setpoint.

15 Claims, 3 Drawing Sheets

FAULT DETECTION SYSTEM FOR ELECTRIC AUTOMOBILE TRACTION SYSTEM HAVING FLOATING GROUND

FIELD OF THE INVENTION

The present invention relates generally to traction battery systems for electric automobiles, and more particularly to systems for detecting faults in traction battery power systems.

BACKGROUND OF THE INVENTION

Electrically powered automobiles are vehicles that do not depend on internal combustion engines for propulsive power, but rather on relatively large electric traction batteries. The traction battery of an electric automobile is engaged with an electric traction motor for propelling the automobile, and the traction battery is rechargeable to permit repeated use of the traction battery.

The skilled artisan will appreciate that a traction battery must have a relatively large capacity, and must deliver a relatively large amount of power, compared to a conventional 12 volt automobile storage battery. The skilled artisan will further appreciate that, because power is directly proportional to battery voltage and system current, the high power delivery requirements which must be satisfied by traction batteries necessarily mean that higher electrical voltages will be present in electric automobiles than in automobiles powered by fossil fuels, which typically require only a comparatively low power, low voltage storage battery for energizing auxiliary loads when the internal combustion engine is not operating.

Because it doesn't require the combustion of fossil fuels, an electric automobile produces little or no environmentally harmful emissions, in contrast to an automobile powered by fossil fuel. For this reason, electric automobiles may become increasingly attractive alternatives to fossil fuel powered cars. Nonetheless, as implied by the discussion above, because of the high voltage requirements of its traction battery an electric automobile raises significant electrical safety More particularly, equipment damage, as well as personal electric shock, which arises from unwanted electric current flow outside of the intended electric circuit flow can have graver consequences when the shock is caused by contact with a high voltage traction battery system, as compared to a conventional, relatively low voltage automotive storage battery system. To reduce the likelihood of such shock, many traction battery systems are not grounded to the automobile chassis, in contrast to conventional automotive storage battery systems. Instead, traction battery systems have a closed loop return path, so that the "ground" of the system (i.e., the electrical current return loop) is isolated from the chassis of the electric car. Such a system is referred to as a "floating ground" system.

The safety advantage inherent in a floating ground traction battery system is that a single fault that creates an electric current path from the system to chassis ground will not result in current flow through the fault medium. This is because, in a floating ground system, a complete current path which is otherwise required for electrical current to flow (and, hence, which is otherwise required to produce electric shock) is not established by only a single fault to chassis ground. Instead, two faults, both of which must effectively short the traction battery system to chassis ground, are required to thereby complete an electric current path before electric shock becomes possible.

As recognized by the present invention, while a single electric fault, or short, between a traction battery system and chassis ground will not cause unwanted current flow, nonetheless it would be advantageous to detect such a fault as soon as it occurs, so that the fault may be corrected before a second fault develops. As further recognized by the present invention, while ground fault detection systems exist, existing ground fault detection systems have certain drawbacks when used in traction battery applications.

For example, the so-called ground fault circuit interrupt (GFCI) system, which measures a current differential between a supply current lead and a return current lead to detect a fault, cannot easily be used for traction battery applications for several reasons. First, more than a single component may function as a power source, depending on the mode of operation of the traction battery system, and thus multiple GFCI sensors would be required. Specifically, the traction battery itself functions as the power source during automobile operation, but the traction motor assumes the power source function during regenerative braking, thus requiring GFCI sensors near both the traction battery and traction motor. Further, when the traction battery is being recharged the battery charger functions as the power source. Consequently, multiple GFCI sensors would be required, and even with multiple sensors, any fault which occurred upstream of a sensor (i.e., between a sensor and a power source) would remain undetected by a GFCI system.

Another existing fault detection system is the resistor bridge circuit, which requires the creation of a short to chassis ground through which test current can flow. As alluded to above, the safety drawbacks inherent in the creation of such a short to chassis ground may be acceptable for some applications, but are unacceptable for high voltage applications. Moreover, the flow of test current through a resistor bridge circuit would tend to unacceptably cause a high current drain on the traction battery.

Still further, voltage variations in a traction battery are considerable, and a fault detection system which has a sensitivity appropriate for monitoring a fully charged traction battery may not be appropriate for monitoring a nearly depleted traction battery, and vice versa.

Accordingly, it is an object of the present invention to provide a system for detecting faults in automobile traction battery systems which is safe and which does not unduly cause traction battery drain. Another object of the present invention is to provide a system for detecting faults in automobile traction battery systems which minimizes the number of fault sensors that must be used. Yet another object of the present invention is to provide a system for detecting faults in automobile traction battery systems which has a sensitivity that changes appropriately with traction battery voltage. Still another object of the present invention is to provide a system for detecting faults in automobile traction battery systems which is easy to use and cost-effective.

SUMMARY OF THE INVENTION

A device is disclosed for detecting, in an electrically propelled automobile having a chassis, an electrical path to the chassis of the automobile from an electric traction system having a floating ground. The device includes a traction battery and a traction motor, and a positive direct current (DC) line and a negative DC line interconnect the traction battery and traction motor.

A positive sampling circuit is electrically connected to the positive DC line for generating a first voltage representative of electric current flow from the battery. Also, a negative sampling circuit is electrically connected to the negative DC line for generating a second voltage representative of electric current flow back to the battery. Further, a summing circuit is electrically connected to the positive and negative sampling circuits for generating a summed signal representative of the first and second voltages. The signal from the summing circuit is sent to a comparator which compares the summed signal to a first reference signal that is proportional to the traction battery voltage. When an unwanted electrical path exists between the chassis and the traction battery, the comparator outputs a fault signal.

Preferably, the comparator compares the summed signal to a second reference signal which is proportional to the traction battery voltage. The comparator outputs the fault signal when an electrical path exists between the chassis and the traction battery. In the preferred embodiment, the first reference signal is a positive sum limit signal and the second reference signal is a negative sum limit signal.

As envisioned by the present invention, a fault signal generator can also be electrically connected to the comparator for receiving fault signals therefrom. Additionally, a battery energy management system (BEMS) is electrically connected to the fault signal generator, and the fault signal generator outputs a fault condition signal to the BEMS when the number of fault signals equals a predetermined number. Thereby, the BEMS is caused to electrically interrupt the DC lines.

Advantageously, a circuit power supply is mounted in the automobile, and one of the sampling circuits selectively electrically interconnects the chassis with the traction battery. In contrast, the other sampling circuit selectively electrically interconnects the circuit power supply with the traction battery, to thereby permit the use of only a single circuit power supply. In the preferred embodiment, each sampling circuit is an RC circuit.

In another aspect of the present invention, a fault detection system for detecting an unwanted electrical path between an electrical traction system of an electric automobile having a chassis and the chassis of the automobile includes a signal sampler. As intended by the present invention, the signal sampler has a plurality of resistor capacitor (rc) circuits that selectively interconnect the traction system with the chassis to generate first and second voltages. The first and second voltages establish a balanced signal in the absence of an unwanted electrical path between the traction system and the chassis. On the other hand, the first and second voltages establish an unbalanced signal which defines a magnitude in the presence of an unwanted electrical path between the traction system and the chassis. An output circuit generates a fault signal when the magnitude of the unbalanced signal equals a predetermined magnitude.

In yet another aspect of the present invention, a method is disclosed for detecting an electrical leakage path between an electric traction system of an electric automobile and the chassis of the automobile. The method of the present invention includes generating a first voltage by storing energy representative of electric current flow through a positive electrical conductor of the traction system. Also, a second voltage is generated by storing energy representative of electric current flow through a negative electrical conductor of the traction system. The voltages are added to generate a sum voltage.

Next, a setpoint voltage is established, and the sum voltage is compared to the setpoint voltage. A fault signal is generated when the sum voltage exceeds the setpoint voltage.

In still another aspect of the present invention, a hardware or software system is disclosed for detecting an electrical leakage path between an electric traction system of an electric automobile and the chassis of the automobile. The system of the present invention includes means for generating a first voltage which is representative of electric current flow through a positive electrical conductor of the traction system. Additionally, the system includes means for generating a second voltage that is representative of electric current flow through a negative electrical conductor of the traction system. Further, the system includes adding means for adding the voltages to generate a sum voltage, and means are provided for establishing a setpoint voltage. Still further, the system includes comparing means for comparing the sum voltage to the setpoint voltage, and output means output a fault signal when the sum voltage exceeds the setpoint voltage.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
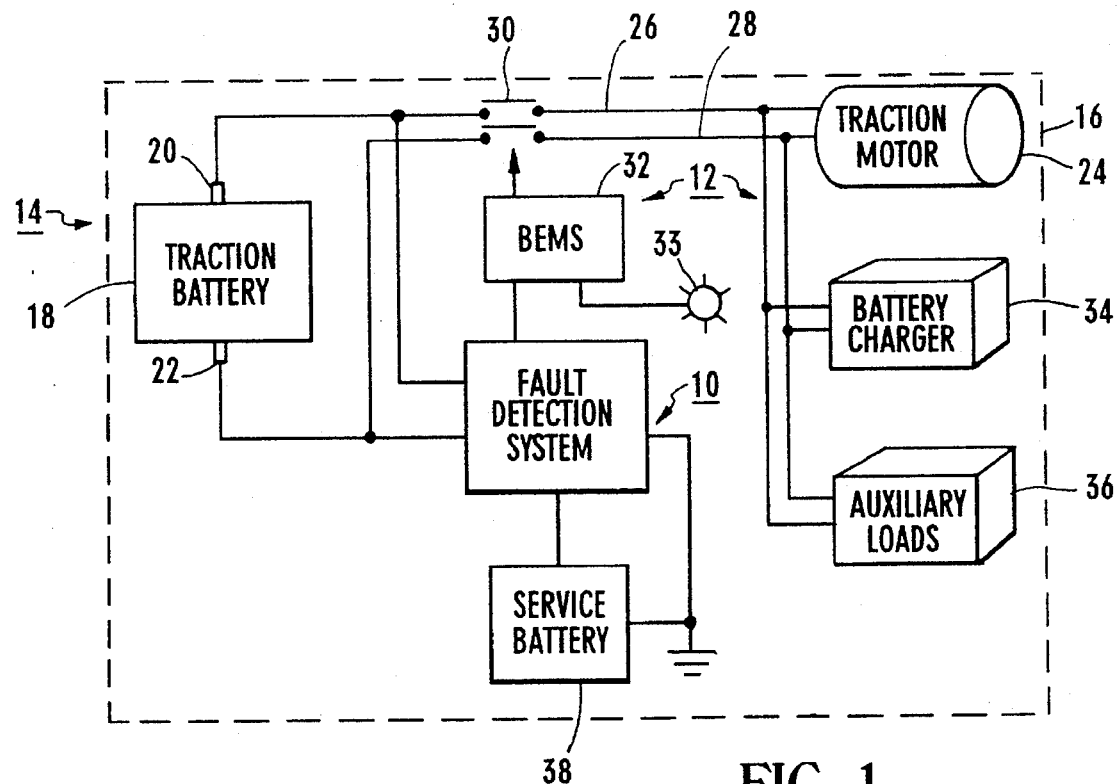
FIG. 1 is a schematic diagram of the overall system for detecting faults in electric automobile traction systems.

Referring initially to FIG. 1, a fault detection system is shown, generally designated 10, for detecting electrical faults in an electric propulsion or traction system, generally designated 12, of an electric automobile, generally designated 14, having a chassis 16. As intended by the present invention, the traction system 12 is a so-called "floating ground" system, i.e., the traction system 12 is electrically isolated from the chassis 16. It is the purpose of the fault detection system 10 to detect faults, i.e., unwanted electrical pathways, from the traction system 12 to the chassis 16. Such faults can be caused by, for example, the breakdown of dielectric insulation which covers electrical conductors in the traction system 12 for insulating the chassis 16 from the traction system 12.

FIG. 1 shows that the traction system 12 includes a high voltage traction battery 18 that has a positive terminal 20 and a negative terminal 22. As schematically shown in FIG. 1, the traction battery 18 is electrically connected to an electric automobile traction motor 24 via a positive electrical line or conductor 26 and a negative electrical line or conductor 28, for energizing the motor 24 and thereby propelling the automobile 14. A main power switch 30 is installed in the lines 26, 28 for interrupting the lines 26, 28 in response to signals from a battery energy management system (BEMS) 32 which in turn is electrically connected to the fault detection system 10. As the skilled artisan will appreciate, the traction battery 28 can be isolated from electrical components downstream of the switch 30 by opening the switch 30. Also, the BEMS 32 can energize a warning lamp 33 or other warning indicator which may be mounted on an instrument panel of the automobile 14. In one intended embodiment, the traction battery 18 is made by Electro-Source of Texas, and the traction motor 24 is made by Westinghouse.

Additionally, the electric automobile 14 can include a battery charger 34 for interconnecting a source of electricity (not shown) which is external to the automobile 14 with the traction system 12, for recharging the traction battery 18. FIG. 1 also schematically shows that one or more auxiliary electrical loads 36 can be electrically connected to the traction system 12. Moreover, the automobile 14 includes a conventional twelve volt automobile service battery 38 which is preferably is connected to the fault detection system 10, as more fully disclosed below. In turn, the fault detection system 10 is electrically connected to both the positive electrical line 26 and negative electrical line 28 and, hence, to both the positive terminal 20 and negative terminal 22 of the traction battery 18.

Figure 2:
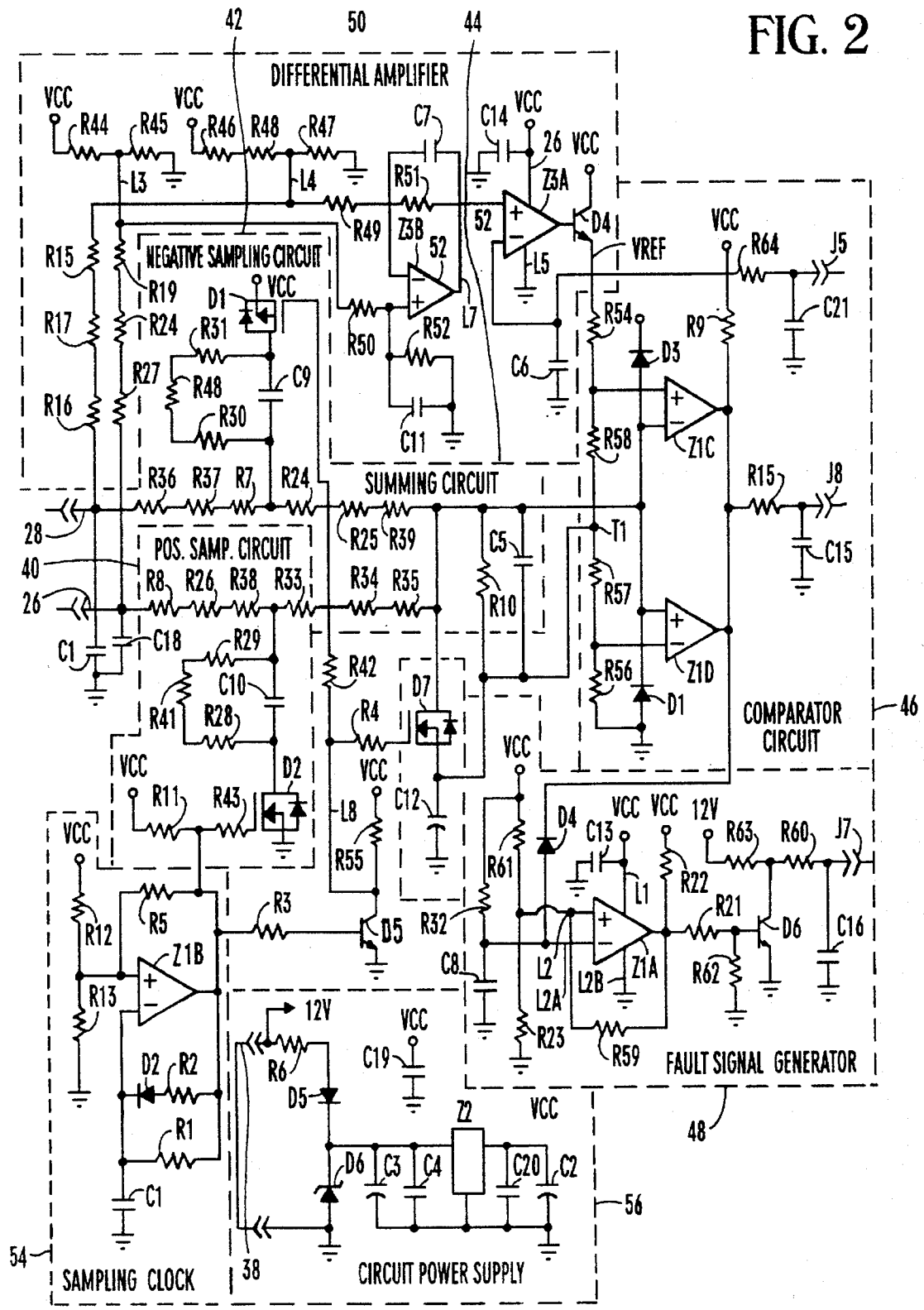
FIG. 2 is an electrical schematic diagram of the fault detection system of the present invention.

Now referring to FIG. 2, the details of the fault detection system 10 can be seen. As shown in FIG. 2, the fault detection system 10 includes a positive sampling circuit 40 that is electrically connected to the positive electrical line 26. As more fully disclosed below, the positive sampling circuit 40 generates a voltage that is representative of electric current flow from the traction battery 18. Further, a negative sampling circuit 42 is electrically connected to the negative electrical line 28 for generating a voltage which is representative of electric current flow back to the traction battery 18.

In the presently preferred embodiment, both of the sampling circuits 40, 42 are RC circuits that store energy, and the stored energy is representative of electric current flow through the respective electrical line or conductor 26, 28 of the traction system 12. More particularly, the positive sampling circuit 40 includes three positive sampling resistors RS, R26, R38 that are connected in series to a positive sampling capacitor C10, to thereby establish an RC circuit. In accordance with principles well-known in the art, the positive sampling capacitor C10 stores energy and consequently establishes a voltage potential across its dielectric medium that is proportional to the electric current flow through the positive electrical line 26. As intended by the present invention, the voltage potential established by the positive sampling capacitor C10 essentially is the output signal of the positive sampling circuit 40.

In the preferred embodiment, three positive parallel resistors R28, R29, R41 are connected in parallel with the positive sampling capacitor C10. Table 1 sets forth resistive and capacitive values for the components of the fault detection system 10. It will be recognized by those skilled in the art that resistors connected in series, such as the positive sampling resistors RS, R26, R38 or the positive parallel resistors R28, R29, R41, can be replaced with a respective single resistor having a resistance value that is equal to the sum of the resistance values of the series resistors it would replace.

Additionally, the positive sampling capacitor C10 is selectively connectable to the chassis 16, represented by an electrical ground symbol, through a positive sampling circuit transistor switch Q2. In the preferred embodiment, the positive sampling circuit transistor switch Q2 is a type VN 0550 MOSFET transistor, although it may alternatively be an IGBT or bipolar transistor. Accordingly, it will be appreciated by the skilled artisan that the sampling switch Q2 can be operated to selectively charge and discharge the positive sampling capacitor C10. To provide power to operate the sampling switch Q2, a circuit power supply, described in greater detail below, having an output represented by the power supply symbol $V_{cc}$ in FIG. 2 is electrically connected to the sampling switch Q2 through resistors R11 and R43.

Like the positive sampling circuit 40, the negative sampling circuit 42 is an RC circuit. More specifically, the negative sampling circuit 42 includes three negative sampling resistors R7, R36, R37 that are connected in series to a negative sampling capacitor C9, to thereby establish an RC circuit. In accordance with principles well-known in the art, the negative sampling capacitor C9 stores energy and consequently establishes a voltage potential across its dielectric medium that is proportional to the electric current flow through the negative electrical line 28. As intended by the present invention, the voltage potential established by the negative sampling capacitor C9 essentially is the output signal of the negative sampling circuit 42.

In the preferred embodiment, three negative parallel resistors R30, R31, R40 are connected in parallel with the negative sampling capacitor C9. Moreover, the negative sampling capacitor C9 is connected to a negative sampling circuit transistor switch Q1. Preferably, the negative sampling circuit transistor switch Q1 is a type VP 0550 MOSFET transistor.

In marked contrast to the positive sampling circuit 40, however, the transistor switch Q1 of the negative sampling circuit 42 does not selectively connect the negative sampling capacitor C9 to chassis ground. Instead, the negative transistor switch selectively connects the negative sampling capacitor C9 to the circuit power supply described below (the output of which is represented by the power supply symbol $V_{cc}$ in FIG. 2), which in turn is powered from the service battery 38. Thus, the output signal voltage of the positive sampling circuit 40 is referenced to to the chassis 16, whereas the output signal voltage of the negative sampling circuit 42 is referenced to $V_{cc}$ (and, hence, is indirectly referenced to the service battery 38).

As recognized by the present invention, by connecting the positive sampling circuit 40 to the chassis 16 ground but connecting the negative sampling circuit 42 to $V_{cc}$ instead of chassis ground, the use of only a single circuit power supply is permitted. This feature of the present invention is particularly advantageous for its intended automotive application, in that automobiles typically carry only a single service battery.

Continuing with the description of FIG. 2, the output signal of the positive sampling circuit 40 is connected to a signal summing circuit 44 which includes three series resistors R33, R34, R35. Likewise, the output signal of the negative sampling circuit 42 is connected to three series resistors R24, R25, R39 of the signal summing circuit 44. Additionally, as shown in FIG. 2, the summing circuit 44 includes an adder resistor R10 that is connected in parallel with an adder capacitor C5.

As intended by the present invention, the function of the summing circuit 44 is to sum together the voltages output by the sampling circuits 40, 42 and generate an output signal in response. When no fault exists, the output signals of the sampling circuits 40, 42 will be of equal magnitude and of opposite polarity. On the other hand, when a fault exists, the polarities of the signals from the sampling circuits 40, 42 will be opposite but their magnitudes will not be equal, depending on the location of the fault.

Stated differently, the sampling circuits 40, 42 and summing circuit 44 establish a signal sampler which generates first and second voltages that establish a balanced signal in the absence of an unwanted electrical path between the traction system 12 and the chassis 16. Moreover, the signal sampler of the present invention establishes an unbalanced signal defining a magnitude in the presence of an unwanted electrical path between the traction system 12 and the chassis 16.

Still referring to FIG. 2, the output signal of the summing circuit 44 is electrically connected to a comparator circuit 46, the function of which is to determine whether the magnitude of the signal from the summing circuit 44 exceeds a predetermined magnitude. In other words, the comparator circuit 46 compares the signal from the summing circuit 44 with a reference signal. More specifically, because the signal from the summing circuit 44 may be negative or positive with respect to the reference signal, the comparator circuit 46 compares the signal from the summing circuit 44 with both a positive threshold limit signal and a negative threshold limit signal that is equal in magnitude but opposite in polarity from the positive sum signal.

As shown in FIG. 2, the comparator circuit 46 includes a resistor ladder network consisting of four comparator resistors R54, R56, R57, R58. As more fully disclosed below, the resistor ladder network receives a reference voltage $V_{ref}$ which is proportional to the voltage of the traction battery 18, and, at its center tap T1, halves the reference voltage $V_{ref}$. Based upon the halved reference voltage, the resistor ladder network of the comparator circuit 46 generates the positive threshold limit signal and lower threshold limit signal against which the output signal from the summing circuit 44 is compared.

The comparator circuit 46 also includes type LM2901 positive and negative comparators Z1C, Z1D. In accordance with the present invention, the comparators Z1C, Z1D compare the signal from the summing circuit 44 against the positive threshold limit signal and lower threshold limit signal. When the magnitude of the signal from the summing circuit 44 exceeds either limit signal, the appropriate comparator Z1C, Z1D generates a fault signal pulse.

FIG. 2 also shows that the comparator circuit 46 is connected to $V_{cc}$ through a first comparator type BAS16 diode D3, and to chassis ground through a second comparator type BAS16 diode D1. It is to be understood that the diodes D1, D3 establish a clamping circuit.

As stated above, when the comparator circuit 46 determines that the signal from the summing circuit 44 exceeds the predetermined magnitude, the comparator circuit 46 outputs a fault signal to a fault signal generator 48. FIG. 2 shows that $V_{cc}$ is connected to the output of the comparator circuit 46 through a resistor R9, and further that the output of the comparator circuit 46 is connected to chassis ground in parallel through a first output resistor R15/output grounding capacitor C15. The output signal of the comparator circuit 46 may be sensed at jack J8 for sending the signal directly to the BEMS 32 or to some other component, e.g., the warning lamp 33 shown in FIG. 1.

In accordance with the present invention, the function of the fault signal generator 48 is to receive fault signals from the comparator circuit 46 and, when the number of fault signals received equals a predetermined number, output a fault condition signal at system output jack J7. The fault signal generator 48 can also extend pulses to, e.g., maintain the warning lamp 33 illuminated for a predetermined time period in the presence of a single large, temporally short fault signal from the comparator circuit 46. The fault condition signal from the fault signal generator 48 is sent to the BEMS 32 (FIG. 1) for, e.g., causing the BEMS 32 to open the main power switch 30 in the presence of a fault. Thereby, the traction battery 18 is isolated from the remainder of the traction system 12 in the presence of an electrical fault.

In understanding the preferred configuration of the fault signal generator 48, continued reference is made to FIG. 2. It is to be understood that the fault signal generator 48 may have configurations other than the one shown in FIG. 2.

Fault signals from the comparator circuit 46 are received through a type BAS16 fault diode D4, and are sent to a type LM2901 fault comparator first stage Z1A via a signal input line L2A. The input signal line L2A is also tapped between a resistor 32 and a capacitor C8. Furthermore, the fault comparator first stage Z1A receives a comparison input signal referenced to $V_{cc}$ through a reference input line L2 in which is installed an input resistor R61, and the reference input line L2 is connected to chassis ground through a grounding resistor R23. It may now be appreciated that the first stage Z1A compares the fault signals from the comparator circuit 46, present on the input line L2A, with the reference signal that is present on line L2.

The fault comparator first stage Z1A also receives a power input from $V_{cc}$ through a power line L1, which in turn is connected to chassis ground through a grounding capacitor C13. Additionally, the first stage Z1A is grounded through a ground line L2B. It is to be understood that the power input and ground lines shown as being connected to the first stage Z1A of the comparator circuit 46 are also connected to a second stage Z1B in the sampling clock circuitry discussed below and the third and fourth stages Z1C, Z1D of the comparator circuit 46.

The output of the fault comparator first stage Z1A is fed back to its input through a feedback resistor R59. $V_{cc}$ is connected to the output line through a resistor R22, and $V_{cc}$ is also connected to chassis ground in parallel with the reference input line L2 through a resistor R32 and a capacitor C8.

Still referring to FIG. 2, the output signal of the fault comparator Z1A is sent through an output resistor R21 and thence to the base of a type MBT4401 output transistor Q6. Also, the base of the output transistor Q6 is grounded through a grounding resistor R62.

In turn, the output signal of the output transistor Q6 is sent to a transistor output resistor R60 to system output jack J7. The output line of the output transistor Q6 is connected to the transistor output resistor R60 and system output jack J7. Also, the output jack J7 is grounded through a grounding capacitor C16, and the output transistor Q6 is connected to $V_{cc}$ through a pull-up resistor R63. As intended by the present invention, the comparator circuit 46 and fault signal generator 48 establish an output circuit.

As mentioned above, the present invention recognizes that the voltage of the traction battery 18 can vary considerably during operation depending on many factors, including the state of charge and temperature of the battery 18. It may now be appreciated that the purpose of establishing the positive threshold limit signal and negative threshold limit signal of the comparator circuit 46 to be proportional to the voltage of the traction battery 18, as described above, is to account for such voltage variation in the traction battery 18.

Essentially, by so establishing the limit signals of the comparator circuit 46, the sensitivity of the fault detection circuit 10 varies as appropriate with the voltage of the traction battery 18. Specifically, the sensitivity of the fault detection system 10 is greater at lower traction battery 18 voltages and lesser at higher traction battery 18 voltages, thereby ensuring that a fault signal is generated upon the occurrence of the same predetermined leakage current independent of voltage. In the preferred embodiment, the threshold leakage current value is three milliamperes (3 ma).

With this in mind, a difference amplifier 50 is provided in the fault detection system 10 for generating the reference voltage alluded to above and represented by the symbol $V_{ref}$ in FIG. 2. The reference voltage $V_{ref}$ is proportional to the voltage of the traction battery 18. In the preferred embodiment, the value of the reference voltage $V_{ref}$ ranges between zero and $V_{cc}$. FIG. 2 shows the preferred configuration of the difference amplifier 50, although it is to be understood that other circuit configurations may be used and are fully within the scope of the present invention.

As shown in FIG. 2, the difference amplifier 50 receives a first input reference signal from $V_{cc}$ through a first input line L3 having a resistor R44, and the resistor is grounded to chassis through a grounding resistor R45. Further, the difference amplifier 50 receives a second input reference signal from $V_{cc}$ through a second input reference line L4 with two series resistors R46, R48, and the resistors R46, R48 are grounded to chassis through a grounding resistor R47.

FIG. 2 shows that the first input reference signal is sent through a resistor R50 to an operational amplifier (opamp) 52 having a first stage Z3B and a second stage Z3A. Also, the first input line L3 is connected to the positive electrical line 26 through series resistors R19, R20, R27. Further, the second input line L4 is connected to the negative electrical line 28 through series resistors R16, R17, R18. Both input lines L3, L4 are grounded through respective grounding capacitors C18, C17.

The input of the opamp 52 is grounded through a grounding resistor R52 which is in parallel with a grounding capacitor C11. Also, the opamp 52 receives power from $V_{cc}$ through an input line L6, and the line L6 is grounded to chassis through a grounding capacitor C14. As show, one terminal of the opamp 52 is grounded through a grounding line L5.

The output signal of the first stage Z3B of the opamp 52 is sent via an output line L7 to the input of the second stage Z3A of the opamp 52. In turn, the output of the second stage Z3A is sent to a type MBT 4401 transistor Q4. This output signal is also fed back to the input of the opamp 52 through a capacitor C7 and, in parallel with the capacitor C7, a resistor R51.

In addition to the input from the opamp 52, the transistor Q4 receives a power input from $V_{cc}$. As shown in FIG. 2, the transistor Q4 sends its output signal $V_{ref}$ to the resistor ladder network of the comparator circuit 46, and the output line of the transistor Q4 is grounded to chassis through a grounding capacitor C6. $V_{ref}$ is connected to jack J5 through a second output resistor R64/output grounding capacitor C21.

Moreover, as described above the halved reference signal (equal to $V_{ref}/2$) is present at the center tap T1 of the resistor ladder network of the comparator circuit 46, and the halved reference signal $V_{ref}/2$ is sent to an enable switch, which in the preferred embodiment is a type 2N7002L enable switch transistor Q7 having an associated reference capacitor C12. Essentially, the reference capacitor holds a halved reference voltage equal to $V_{ref}/2$ for reference by the comparator circuit 46.

Continuing with the description of FIG. 2, a sampling clock 54 is provided to cyclically cause the sampling switches Q1, Q2, and enable switch transistor Q7 to sample the voltage of the traction battery 18. In one presently preferred embodiment, the sampling clock 54 generates a one hundred Hertz (100 Hz) square wave at a ten percent duty cycle to toggle the sampling switches Q1, Q2, and enable switch Q7. Preferably, the sampling clock 54 includes a transistor Q5 and a type LM2901 sampling comparator Z1B. The output of the sampling comparator Z1B is sent to the positive sampling switch Q2 and, through a resistor R3 and a type MBT 4401 transistor Q5 in a line L8, the negative sampling circuit switch Q1. The line L8 includes a resistor R42, and the line L8 is connected to the enable switch transistor Q7 through a resistor R4. The transistor Q5 also receives an input from $V_{cc}$ through a resistor R55.

FIG. 2 shows that the output signal of the sampling comparator Z1B is fed back to its input side through a resistor R5. Also, the output signal of the sampling comparator Z1B is fed back to its input side through a resistor R2 and type BAS16 diode D2, as well as through a resistor R1 which is in parallel with the resistor R2 and diode D2. Both of these last-mentioned feedback lines are grounded through a grounding capacitor C1. The sampling comparator Z1B also receives an input from $V_{cc}$ through a resistor R12, and the resistor R12 is grounded to chassis through a grounding resistor R13.

Completing the description of FIG. 2, the fault detection system 10 includes a circuit power supply 56 for generating $V_{cc}$. As shown, the power supply 56 receives a positive input from the service battery 38 through a resistor R6 and a type 1N4001 diode D5, and the power supply 56 is electrically connected to the negative terminal of the service battery 38 through a twenty seven volt, one-half watt zener diode D6. Connected to chassis ground in parallel with the zener diode D6 are power supply capacitors C2, C3, C4, C19, and C20, along with a type LM78L05 voltage regulator. The output of the power supply 56 is $V_{cc}$, which in the preferred embodiment is equal to five volts DC. It is to be understood that the sampling clock 54 and power supply 56 may have configurations other than the ones shown.

Figure 3:
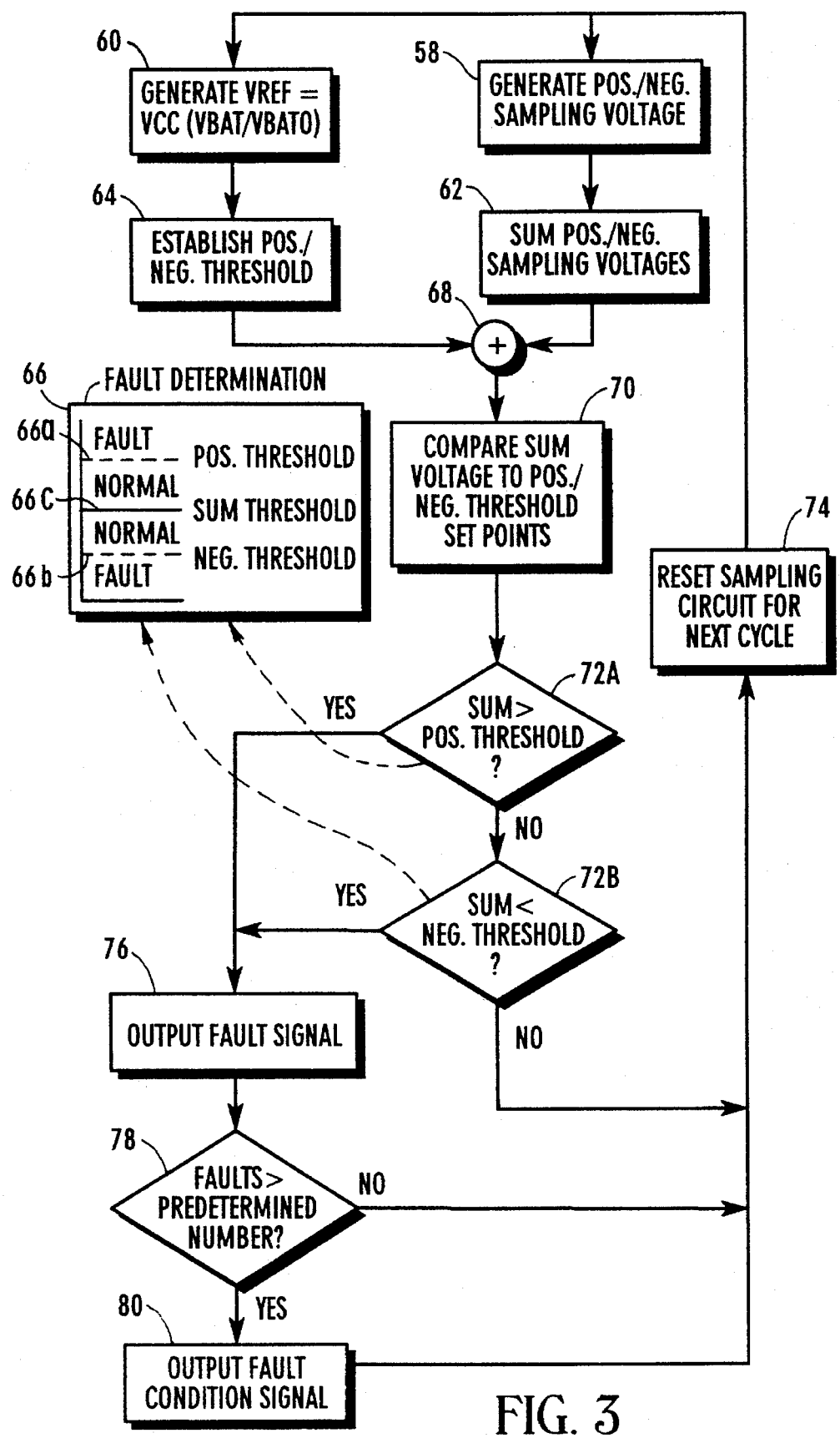
FIG. 3 is a flow chart showing the logic of the fault detection system of the present invention.

Now referring to FIG. 3, the operation of the fault detection system 10 can be appreciated. Starting at block 58, the sampling switches Q1, Q2 are closed to cause the sampling circuits 40, 42 to generate respective sampling voltages. Also, at block 60, the differential amplifier 50 generates $V_{ref}$ and establishes $V_{ref}$ to be proportional to the ratio of the actual voltage $V_{batt}$ of the traction battery 18 to a maximum battery voltage $V_{batt0}$ of the traction battery 18. At block 62, the sampling voltages are summed by the summing circuit 44.

Additionally, at block 64, the comparator circuit 46 establishes the positive and negative threshold limit signals, based upon $V_{ref}/2$. Window 66 graphically represents the positive and negative threshold limit signals as dashed lines 66a, 66b, respectively.

The signals from blocks 62 and 64 are summed as indicated at summing circle 68, and at block 70, the comparator circuit 46 compares the sum voltage from the summing circuit 44 to the positive and negative threshold limit signals. At decision blocks 72A, 72B, the comparator circuit 46 determines whether the sum voltage exceeds either one of the positive or negative threshold limit signals, respectively. If not, the fault detection circuit 10 proceeds to block 74, the sampling switches Q1, Q2 are opened and the reset switch Q7 is closed to configure itself for the next sample, and then loops back to blocks 58 and 60. Window 66 graphically displays that when the sum voltage is balanced, i.e., when the sum voltage is between the threshold lines 66a, 66b, i.e., a normal (non-fault) condition is indicated. The sum voltage is exactly balanced when the voltage equals the baseline balanced voltage indicated by solid line 66c.

On the other hand, if, at either one of decision blocks 72A, 72B, the comparator circuit 46 determines that the sum voltage indeed exceeds the positive or negative threshold limit signals, the comparator circuit 46 outputs a fault signal at block 76. Window 66 graphically indicates that a fault condition is indicated when the sum voltage is not balanced, i.e., when the sum voltage is greater than the positive threshold limit signal or less than the negative threshold limit signal.

When a fault condition is present, at decision block 78 the fault signal generator 48 determines whether the number of fault signal pulses received from the comparator circuit 46 equals a predetermined number, e.g., three. If not, the fault signal generator 48 loops back to block 74. Otherwise, the fault signal generator outputs a fault condition signal to the BEMS 32 at block 80, then loops back to block 74.

It is to be understood that in an alternate embodiment, the steps shown in FIG. 3 could be established by software programmed to carry out method steps shown in FIG. 3. These steps could be performed, e.g., by a software program storage device 82, shown in FIG. 4, which may be part of a digital computer 84. In this alternate embodiment, the program storage device 82 receives voltage signals from the traction battery 18, performs the method steps shown in FIG. 3, and outputs a fault condition signal when appropriate to the BEMS 32. In accordance with the present invention, the program storage device 82 may be implemented by a processor within the computer 84 that executes a series of computer-executable instructions. These instructions may reside, for example, in RAM and/or ROM of the computer 84. Alternatively, the instructions may be contained on a data storage medium, such as a computer diskette. Or, the instructions may be stored on a DASD array, magnetic tape, conventional hard disk drive, electronic read-only memory, optical storage device, or other appropriate data storage device. In such an alternate embodiment, the computer-executable instructions may be lines of compiled executable codes, such as C++ language code.

Figures 4, 5:
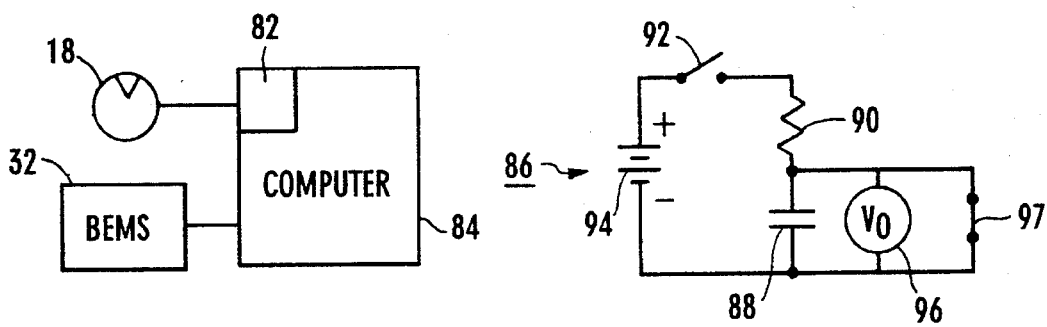
FIG. 4 is a schematic block diagram of an alternate software embodiment of the present invention.
FIG. 5 is a simplified electrical schematic diagram of an alternate embodiment of the positive sampling circuit of the present invention.
Figure 6:
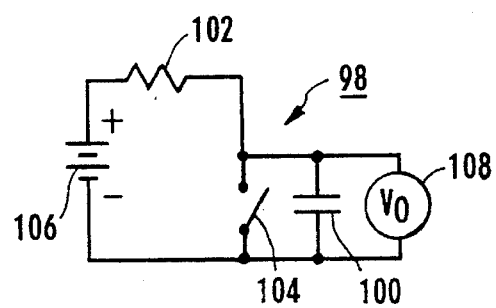
FIG. 6 is a simplified electrical schematic diagram of yet another alternate embodiment of the positive sampling circuit of the present invention.
Figure 7:
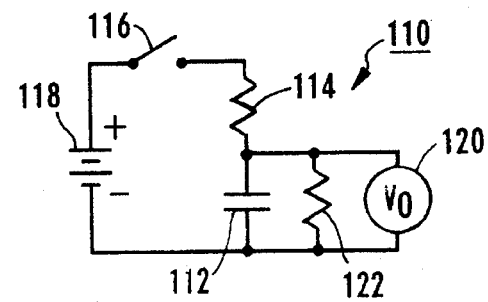
FIG. 7 is a simplified electrical schematic diagram of still another alternate embodiment of the positive sampling circuit of the present invention.

FIGS. 5–7 show alternate configurations of the positive sampling circuit of the present invention, which can be used in lieu of the positive sampling circuit 40 shown in FIG. 2.

It is to be understood that each circuit shown in FIGS. 5–7 can also be connected in an opposite polarity to that shown and then used in place of the negative sampling circuit 42 shown in FIG. 2. Each circuit shown in FIGS. 5–7 has a sampling mode, wherein the associated RC circuit charges as appropriate for the ground condition, and a reset mode, wherein the RC circuit discharges between sampling modes.

Referring to FIG. 5, a sampling circuit is shown, generally designated 86. The sampling circuit 86 includes a capacitor 88 and a resistor 90 which together establish an RC sampling circuit. A sampling switch 92 is schematically shown in FIG. 5 to be in electrical series with the resistor 90 and capacitor 88, and the sampling switch 92 periodically closes to cause the RC sampling circuit to sample electrical current flow from the positive conductor of a traction battery 94. The output signal of the RC sampling circuit shown in FIG. 5 is sensed across the capacitor 88 at output 96. A reset switch 97 closes when the sampling switch 92 opens between sampling cycles to reset (discharge) the capacitor 88.

FIG. 6 shows a sampling circuit, generally designated 98, which includes a capacitor 100 and a resistor 102 which together establish an RC sampling circuit. A sampling switch 104 is schematically shown in FIG. 5, and the sampling switch 104 is connected in parallel with the capacitor 100 for causing the circuit to periodically sample the positive conductor of a traction battery 106, and then reset after each sampling cycle. The output signal of the RC sampling circuit shown in FIG. 6 is sensed across the capacitor 100 at output 108.

FIG. 7 shows a sampling circuit, generally designated 110, which includes a capacitor 112 and a resistor 114 which together establish an RC sampling circuit. A sampling switch 116 is schematically shown in FIG. 7, and the sampling switch 116 is connected in series with the resistor 114 for causing the circuit to periodically sample the positive conductor of a traction battery 118. The output signal of the RC sampling circuit shown in FIG. 7 is sensed across the capacitor 112 at output 120. A parallel resistor 122 is connected in parallel with the capacitor 112 and output 120 to periodically reset the capacitor 112.

While the particular FAULT DETECTION SYSTEM FOR ELECTRIC AUTOMOBILE TRACTION SYSTEM HAVING FLOATING GROUND as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims.

TABLE 1

| RESISTOR | VALUE (ohms) | RESISTOR | VALUE (ohms) | CAPACITOR |
|---|---|---|---|---|
| R1 | 150K | R31 | 180K | C1 - .1 µFARADS |
| R2 | 15K | R32 | 10K | C2 - 100 µF |
| R3 | 10K | R33 | 510K | C3 - 100 µF |
| R4 | 10K | R34 | 510K | C4 - .1 µF |
| R5 | 100K | R35 | 510K | C5 - 10 nF |
| R6 | 47 | R36 | 10K | C6 - .1 µF |
| R7 | 10K | R37 | 10K | C7 - 1 nF |
| R8 | 10K | R38 | 10K | C8 - .1 µF |

TABLE 1-continued

| RESISTOR | VALUE (ohms) | RESISTOR | VALUE (ohms) | CAPACITOR |
|---|---|---|---|---|
| R9 | 1K | R39 | 510K | C9 - 4.7 nF |
| R10 | 2.61K | R40 | 180K | C10 - 4.7 nF |
| R11 | 1K | R41 | 180K | C11 - 1 nF |
| R12 | 100K | R42 | 5.1K | C12 - 100 µF |
| R13 | 100K | R43 | 5.1K | C13 - .1 µF |
|  |  | R44 | 10K | C14 - .1 µF |
| R15 | 1K | R45 | 10K | C15 - 100 pF |
| R16 | 5M | R46 | 10K | C16 - 100 pF |
| R17 | 5M | R47 | 10K | C17 - 100 pF |
| R18 | 5M | R48 | 680 | C18 - 100 pF |
| R19 | 5M | R49 | 82K | C19 - 4.7 µF |
| R20 | 5M | R50 | 82K | C20 - .1 µF |
| R21 | 1K | R51 | 1M | C21 - 100 pF |
| R22 | 1K | R52 | 1M |  |
| R23 | 100K |  |  |  |
| R24 | 510K | R54 | 470 |  |
| R25 | 510K | R55 | 470 |  |
| R26 | 10K | R56 | 470 |  |
| R27 | 5M | R57 | 200 |  |
| R28 | 180K | R58 | 200 |  |
| R29 | 180K | R59 | 100K |  |
| R30 | 180K | R60 | 470 |  |
|  |  | R61 | 100K |  |
|  |  | R62 | 10K |  |
|  |  | R63 | 2.2K |  |
|  |  | R64 | 1K |  |

We claim:

1. A device for detecting, in an electrically propelled automobile having a chassis, an electrical path to the chassis of the automobile from an electric traction system having a floating ground, comprising:

a traction battery;

a traction motor;

a positive direct current (DC) line and a negative DC line interconnecting the traction battery and traction motor;

a positive sampling circuit electrically connected to the positive DC line for generating a first voltage representative of electric current flow from the battery;

a negative sampling circuit electrically connected to the negative DC line for generating a second voltage representative of electric current flow back to the battery;

an summing circuit electrically connected to the positive and negative sampling circuits for generating a summed signal representative of the first and second voltages; and a comparator electrically connected to the summing circuit for comparing the summed signal to a first reference signal which is proportional to the traction battery voltage and outputting a fault signal in response thereto when an electrical path exists between the chassis and the traction battery.

2. The device of claim 1, wherein the comparator compares the summed signal to a second reference signal which is proportional to the traction battery voltage and outputs the fault signal in response thereto when an electrical path exists between the chassis and the traction battery, wherein the first reference signal is a positive threshold limit signal and the second reference signal is a negative threshold limit signal.

3. The device of claim 1, further comprising a fault signal generator electrically connected to the comparator for receiving fault signals therefrom and a battery energy management system (BEMS) electrically connected to the fault signal generator, wherein the fault signal generator outputs a fault condition signal to the BEMS when the number of fault signals equals a predetermined number, for causing the BEMS to electrically interrupt the DC lines.

4. The device of claim 3, further comprising a circuit power supply mounted in the automobile, wherein one of the sampling circuits selectively electrically interconnects the chassis with the traction battery and the other sampling circuit selectively electrically interconnects the circuit power supply with the traction battery, to thereby permit the use of only a single circuit power supply.

5. The device of claim 4, wherein each sampling circuit is an RC circuit.

6. A fault detection system for detecting an unwanted electrical path between an electrical traction system of an electric automobile having a chassis and the chassis of the automobile, comprising:

a signal sampler having a plurality of resistor capacitor (rc) circuits selectively interconnecting the traction system with the chassis for generating first and second voltages which establish a balanced signal in the absence of an unwanted electrical path between the traction system and the chassis, the first and second voltages establishing an unbalanced signal defining a magnitude in the presence of an unwanted electrical path between the traction system and the chassis; and an output circuit electrically connected to the signal sampler for generating a fault signal when the magnitude of the unbalanced signal equals a predetermined magnitude.

7. The fault detection system of claim 6, wherein the electrical traction system includes a traction battery characterized by a variable voltage, and the predetermined magnitude is proportional to the voltage of the traction battery.

8. The fault detection system of claim 7, wherein the traction battery has a positive terminal and a negative terminal, and the signal sampler comprises:

a positive sampling RC circuit electrically connected to the positive terminal for generating the first voltage;

a negative sampling RC circuit electrically connected to the negative terminal for generating the second voltage; and an summing electrically connected to the positive and negative sampling RC circuits for generating the balanced and unbalanced signals established by the first and second signals.

9. The fault detection system of claim 8, wherein the output circuit comprises:
- a comparator electrically connected to the summing for comparing the signal therefrom to a positive predetermined magnitude and a negative predetermined magnitude and outputting a fault signal in response thereto when an electrical path exists between the chassis and the traction battery;
- a fault signal generator electrically connected to the comparator for receiving fault signals therefrom; and
- a battery energy management system (BEMS) electrically connected to the fault signal generator, wherein the fault signal generator outputs a fault condition signal to the BEMS when the number of fault signals exceeds a predetermined number, for causing the BEMS to electrically disconnect the traction battery from the traction system.

10. The fault detection system of claim 9, further comprising a circuit power supply mounted in the automobile, wherein one of the sampling RC circuits is referenced to the chassis and the other sampling RC circuit is referenced to the circuit power supply, to thereby permit the use of only a single circuit power supply.

11. A method for detecting an electrical leakage path between an electric traction system of an electric automobile and the chassis of the automobile, comprising the steps of:
- (a) generating a first voltage by storing energy representative of electric current flow through a positive electrical conductor of the traction system;
- (b) generating a second voltage by storing energy representative of electric current flow through a negative electrical conductor of the traction system;
- (c) adding the voltages to generate a sum voltage;
- (d) establishing a setpoint voltage;
- (e) comparing the sum voltage to the setpoint voltage; and
- (f) outputting a fault signal when the sum voltage exceeds the setpoint voltage.

12. The method of claim 11, wherein the electrical traction system is characterized by a variable system voltage, and the setpoint voltage is established to be proportional to the system voltage.

13. The method of claim 12, wherein the automobile includes a service battery, and the method further comprises the steps of:
- referencing the first voltage to the chassis; and
- referencing the second voltage to the service battery.

14. A hardware or software system for detecting an electrical leakage path between an electric traction system of an electric automobile and the chassis of the automobile, comprising:
- (a) means for generating a first voltage representative of electric current flow through a positive electrical conductor of the traction system;
- (b) means for generating a second voltage representative of electric current flow through a negative electrical conductor of the traction system;
- (c) adding means connected to the generating means for adding the voltages to generate a sum voltage;
- (d) means for establishing a setpoint voltage;
- (e) comparing means connected to the adding means for comparing the sum voltage to the setpoint voltage; and
- (f) output means connected to the comparing means for outputting a fault signal when the sum voltage exceeds the setpoint voltage.

15. The system of claim 14, wherein the electrical traction system is characterized by a variable system voltage, and the setpoint voltage is established to be proportional to the system voltage.

* * * * *